United States Patent [19]

Yamada et al.

[11] Patent Number: 5,081,353
[45] Date of Patent: Jan. 14, 1992

[54] COMBINED SCANNING ELECTRON AND SCANNING TUNNELLING MICROSCOPE APPARATUS AND METHOD

[75] Inventors: Osamu Yamada; Yasushi Nakaizumi, both of Katsuta; Eiichi Hazaki, Tsuchiura, all of Japan

[73] Assignee: Hitachi, Ltd., Tokyo, Japan

[21] Appl. No.: 653,245

[22] Filed: Feb. 11, 1991

[30] Foreign Application Priority Data

Feb. 9, 1990 [JP] Japan ................................. 2-31142

[51] Int. Cl.$^5$ ............................................. H01J 37/28
[52] U.S. Cl. .................................. 250/306; 250/307; 250/491.1
[58] Field of Search ...................... 250/306, 307, 491.1

[56] References Cited

PUBLICATIONS

Binnig et al., Scanning Electron Microscopy, 1983 III, pp. 1079–1082.
Ichinokawa et al., Ultramicroscopy 23 (1987), pp. 115–118.
Vazquez et al., Rev. Sci. Instrum, 59(8), Aug. 1988, pp. 1286–1289.

Primary Examiner—Jack I. Berman
Attorney, Agent, or Firm—Antonelli, Terry, Stout & Kraus

[57] ABSTRACT

A sample is mounted on a support table adjacent a probe of a scanning tunnelling microscope, the support table permitting the sample to move relative to the probe. The probe is also movable in a direction generally perpendicular to the sample surface, between a withdrawn position and a scanning separation. A scanning electron microscope is located adjacent the sample and probe, and its electron beam scans both the sample and the probe and generates an image on a display from electrons from the sample detected by a detector. In order that that operator can position the probe on a target of a sample, for scanning by the probe, a marker is generated on the display by a graphics display unit, which marker indicates the probe-to-sample separation and preferably indicates the probe-to-sample approach point and the direction of movement of the probe towards the sample. The graphics display unit may alternatively, or in addition, generate a marker representing the scan area of the probe when it is moved to a scanning separation from the sample.

24 Claims, 5 Drawing Sheets

COMBINED SCANNING ELECTRON AND SCANNING TUNNELLING MICROSCOPE APPARATUS AND METHOD

BACKGROUND OF THE INVENTION

1. Field of the Invention

The present invention relates to a combined scanning electron and scanning tunnelling microscope apparatus, and to a method of scanning using such an apparatus. In such an apparatus, a scanning tunnelling microscope has its probe locatable in the scanning area of a scanning electron microscope, to enable the scanning area of the probe of the scanning tunnelling microscope to be determined.

2. Summary of the Prior Art

A scanning tunnelling microscope (hereinafter referred to as a "STM"), has a probe, normally of thin metallic material. The probe is normally positioned so that its longitudinal axis is substantially perpendicular to the sample, and the probe is movable in that axial direction. When the probe is brought very close to the surface of the sample (e.g. about 1 nm), and a predetermined voltage is applied between the probe and the sample, a tunnel current may be generated. By controlling the separation between the probe and the surface of the sample, so that the separation is constant, a constant tunnel current will be achieved. Therefore, if the probe is caused to scan over the surface of the sample, either one-dimensionally or two-dimensionally, and the location of the probe is controlled to maintain the tunnel current constant, the movement of the probe in its axial direction represents the surface irregularity of the sample.

From this movement, an image of the surface irregularity of the sample can be achieved. An STM has an extremely high spatial resolution, and this is sufficiently high to distinguish atomic structures, so that the image will give information concerning the atomic structure of surface of the sample. The basic principles of such an STM are described in e.g. "Scanning Electron Microscopy"/1983/III pages 1070–1082.

Although an STM has a high spatial resolution, its scanning range is extremely narrow, with a maximum of about 10 um. Thus, the probe of the STM must be located precisely on a target region of the sample, and it is not practically possible to use the STM itself to locate the position of that target. Therefore, it is necessary to use another microscope of a different type to pre-locate the probe relative to the target of the sample before the STM can carry out its scanning operation.

If an STM is combined with an optical microscope, the gap between the objective lense of the optical microscope and the surface of the sample is too small to allow observation of both the sample and the probe simultaneously. Attempts have been made, in e.g. "Industrial Applications of Charge Particle Beams" from The Japan Society for the Promotion of Science, 132 Committee, 109 Study Report, pages 41–46, to make use of an optical microscope in conjunction with an STM, but the optical and geometrical arrangements needed are complex.

Therefore, it has been proposed to combine an STM with a scanning electron microscope (hereinafter referred to as an "SEM"). With an SEM, it is possible to obtain an image of both a part of the sample and the probe of the STM. Examples of such a combination, producing a combined scanning electron and scanning tunnelling microscope apparatus are shown in e.g. JP-A-63-298951 and the article entitled "Scanning Tunnelling Microscope Combined with Scanning Electron Microscope" by T Ichinokawa et al in Ultramicroscopy 23(1987) pages 115 to 118.

FIG. 1 of the accompanying drawings shows a simplified apparatus in which a SEM and STM are combined. In FIG. 1, a sample 100 is mounted adjacent a probe 101 of a STM, the sample 100 being mounted on a support table 102. The longitudinal axis of the probe 101 is substantially perpendicular to the surface of the sample 100, and the probe is movable along that axis. A SEM 103 is mounted adjacent the sample 100 and the probe 101, and generates an electron beam 104 directed towards the sample 100. It can be seen that the table 102 is inclined relative to the beam 104, and the table 102 is designed to permit relative movement of the sample 100 and probe 101 perpendicular to the longitudinal axis of the probe 101. Furthermore, the probe 101 and table 102 are mounted on a support 105 which itself may be movable relative to the SEM 103. When the beam 104 is caused to scan the sample 100, the probe 101 may be moved into the scan area of the beam 104, so that a part of the sample 100 and the probe 101 can be observed simultaneously on a display screen of the SEM.

Of course, there still remains the problem that the probe 101 must be located at the target site on the sample 100 before the STM can operate. In the article entitled "SEM/STM Combination for STM Tip Guidance" by M Anders et al in Ultramicroscopy 24 (1988) pages 123–128, it was suggested that use should be made of a pattern of markers on the sample, which markers on the sample had known positions relative to the target. Thus, if the operator saw one of those markers in the display of the SEM, he would be able to find the location of the target itself. Indeed, in that article it was proposed that the target itself be used as the marker, if it was sufficiently recognisable.

This arrangement enable the target to be located, but there is then a further problem. FIG. 2 of the accompanying drawings shows schematically the display image of the SEM, displaying an image 100a of part of the sample 100 in FIG. 1, and an image 101a of the tip of the probe 101. The display has no parallax between the image 100a of the part of the sample and the image 101a of the tip of the probe 101. Therefore the display does not clearly indicate the relative positions of the sample and probe. When the sample 100 is moved relative to the probe 101, it is important that the tip 101a of the probe is spaced by a sufficient distance from the sample so that surface irregularities in the sample will not cause contact between the sample and the tip of the probe. However, when the STM operates, the tip must be around 1 nm from the sample surface. Therefore, it is not possible from the display image for the operator to be able to determine, during movement of the sample 100 relative to the probe 101, whether the probe 101 will be accurately aligned with the target point on the sample when the probe is moved axially to its scanning distance.

In an article entitled "Surface Investigations with a Combined Scanning Electron-Scanning Tunnel Microscope" by Fuchs et al, in Scanning Vol. 12 pages 126 to 132, it was proposed to make use of a shadow arrangement. In the operation of an SEM, the image is generated from electrons from the sample, and these electrons may be back-scattered electrons or secondary electrons. The article by H Fuchs et al proposed to suppress the secondary electrons, and make use of the back scattered electrons, as it was found that these would generate a shadow of the probe tip on the sample. Therefore, the display of the SEM showed the sample, the tip of the probe, and a shadow, with the tip of the probe, and the tip of the shadow being spaced by a distance related to the separation of the sample and the tip of the probe. Therefore, some parallax information was given.

SUMMARY OF THE INVENTION

In the proposal by Fuchs et al discussed above, secondary electrons were suppressed. However, if the SEM image is based on secondary electrons, this gives a better spatial resolution than the use of back-scattered electrons. Hence, to obtain parallax information by a shadow arrangement is unsatisfactory.

Therefore, the present invention proposes that the combined scanning electron and scanning tunnelling microscope apparatus generates a marker on the display displaying the scan image of the SEM, which marker represents the probe to sample separation.

Thus, when the operator is adjusting the relative location of the target and STM probe, he has an immediate visual indication of the spacing, and can readily ensure that that spacing is sufficiently large to prevent contact, and at the same time have information which will tell him how far the image of the probe would move on the display if the probe were moved axially to its scanning distance.

The present specification is concerned with both method and apparatus aspects of the present invention.

Preferably, the marker is shaped so that it also represents a probe-to-sample approach point (the point where the probe will be located when it is at its scanning distance) and/or indicates the direction of movement of the probe when it is moved axially towards the sample. In order to achieve these effects, the marker may be a line on the screen, whose length represents the probe-to-sample separation, and one end point of which indicates the probe to sample approach point. The direction of the line then can represent the direction of movement of the probe. The other end point of the marker indicates the actual position of the probe when the probe is at a predetermined spacing.

Thus, the probe is first aligned with the end of the line marker opposite to that representing the approach position, and then the relative locations of the sample and probe are adjusted so that the end representing the approach point coincides with the target. In that position, the probe is spaced from the target by the separation corresponding to the length of the line marker. These two operations could be carried out in reverse order, but in practice this is less likely, because the first step will normally be carried out by moving both the probe and the sample relative to the electron beam of the SEM, and then subsequently adjusting the sample table. In order to move the probe relative to the beam, it is possible to adjust either the location of the probe itself or to adjust the path of the beam. Alternatively, it is possible electronically to move the marker on the display until its one end point coincides with the probe. These movements may be achieved manually or automatically.

Sometimes, for example when changing the focus of the SEM, the direction of movement of the probe may become mis-aligned with the marker. In this case, it would be possible electronically to rotate the marker, o to change the direction of movement of the probe, but preferably the SEM beam itself is rotated. In each case it is desirable for there to be some indication when alignment has been achieved. If the marker is a line marker, as discussed above, the line marker may be extended, and then it becomes relatively straightforward to align the probe with the extended line.

When the line marker, or other marker indicating the spacing is generated, it is necessary for the means generating that marker to know the spacing of the sample and probe. One way to determine this is to cause the tip of the probe to approach any point of the sample, until a tunnelling current is detected. At that time, the probe is of the order of 1 nm from the sample, so that probe may then be withdrawn from the sample by a predetermined distance. That predetermined distance is then the separation of the probe from the surface which can be displayed by the marker.

So far, the use of a marker which represents the probe to sample spacing has been discussed. However, it was mentioned earlier that an STM has a very limited scanning area, e.g. of the order of 10 um. Therefore, the present invention proposes that a scanning area marker be generated on the display, corresponding to the scan area of the probe. Such a scanning area marker may be combined with the marker representing separation, as discussed earlier, but such a scanning area marker represents an independent aspect of the present invention. Such a scanning area marker may be shown as a square or rectangular outline on the display, but other shapes are possible, e.g. using highlighting.

Although a line marker has been discussed above, it is possible for the marker to be of any suitable shape or configuration, and graphical markers may also be used in connection with the present invention.

BRIEF DESCRIPTION OF THE DRAWINGS

Embodiments of the present invention will now be described in detail, by way of example, with reference to the accompany drawings in which.

DETAILED DESCRIPTION

Figure 1:
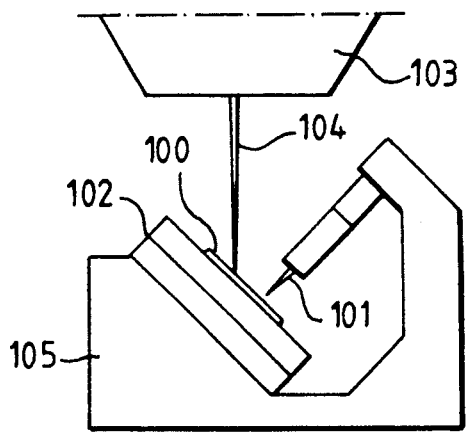
FIG. 1 shows a general schematic view of a combined scanning electron and scanning tunnelling microscope, and has already been discussed.
Figure 2:
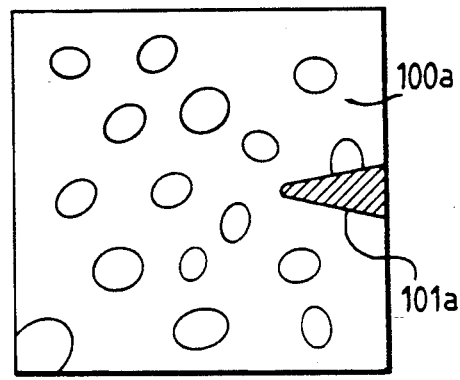
FIG. 2 shows the scanning electron microscope display of the apparatus of FIG. 1, operating according to the standard known method and has already been disucssed.
Figure 3:
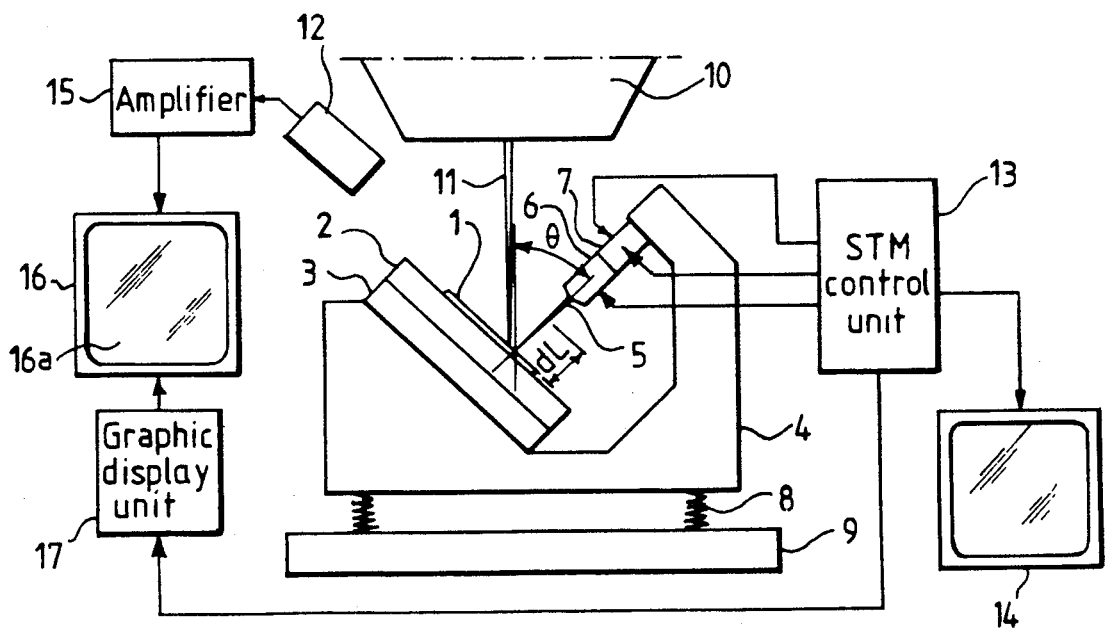
FIG. 3 shows a general schematic view of a combined scanning electron and scanning tunnelling microscope according to an embodiment of the present invention.

FIG. 3 shows a schematic diagram of a combined scanning electron and scanning tunnelling microscope apparatus of an embodiment of this invention. In FIG. 1, a sample 1 is placed on a sample table consisting of a table 2 movable in the X-axis and a table 3 movable in the Y-axis. Because the sample table is placed diagonally on an STM base 4, the sample 1 is in a tilted position to the horizontal as shown in FIG. 1. The sample 1 is capable of being moved two dimensionally relative to the STM base 4 through movement in the X and Y axes of the tables 2 and 3.

An STM probe is mounted on the STM base 4 through piezoelectric elements 6 and 7. The tip of the probe 5 is placed facing the surface of the sample 1, and the movable axis of the probe 5 is placed substantially perpendicular to the sample surface. The piezoelectric element 6 functions to expand and contracts when a voltage is applied, so as to move the probe 5 in its axial direction, i.e. towards and away from the sample surface, while the piezoelectric element 7 having bi-directional electrodes crossing at right angles strains when a voltage is applied to these electrodes so as to allow the probe 5 to scan two dimensionally over the sample surface. The scanning range by this means can be set at 1 nm to a maximum of 10 $\mu$m, determined by the voltage to be applied.

The STM base 4 is mounted on a movable table 9 through a vibration isolation damper 8. The object lens of an SEM 10 is located above the STM base 4. The movable table 9 permits the STM base 4 to move relative to the object lens of the SEM 10. An electron beam 11 is output from the object lens of the SEM 10. The electron beam 11 is caused to scan over a range of a maximum of several millimeters, and the scanned area includes the tip of the probe 5. Secondary electrons emitted from the sample 1 when it is irradiated with the electron beam 11 are detected in a detector 12. As described above, because the sample 1 and the probe 5 are placed on the STM base 4 in a tilted position, the eventual axial direction of the probe 5, has a tilted angle of $\theta$ to the electron beam 11.

As described above, the components of STM consisting of e.g. the STM base 4, and the probe 5 are placed beneath the object lens of the SEM, and may be incorporated in a sample chamber (not shown), thus forming a combined scanning electron and scanning tunnelling microscope apparatus.

The peripheral components of STM and the SEM will now be discussed. An STM control unit 13 detects the tunnel current flowing through the probe 5, and is also arranged to apply suitable voltages to the piezoelectric elements 6 and 7 so as to vary the length of each piezoelectric element 6, 7. A STM image of the surface of the sample 1 is generated by giving to the STM image display unit 14, probe 5 position data obtained in the STM control unit 13 by varying and controlling the probe position so as to retain a constant tunnel current. The detector 12 of SEM, which detects secondary electron emission, is connected to an amplifier 15. The secondary electron emission signal detected by the detector 12 is amplified in the amplifier 15 and is sent to a SME image display unit 16, and a scanning electron beam image is displayed on a display 16a. A graphic display unit 17 causes the display 16a to display a graphic marker of desired form, superimposed on the scanning electron beam image of the SEM 10. The graphic display unit 17 is also connected to the STM control unit 13 so as to read position data of the probe for displaying the marker on the display 16a of the SEM image display unit 16.

Figure 4:
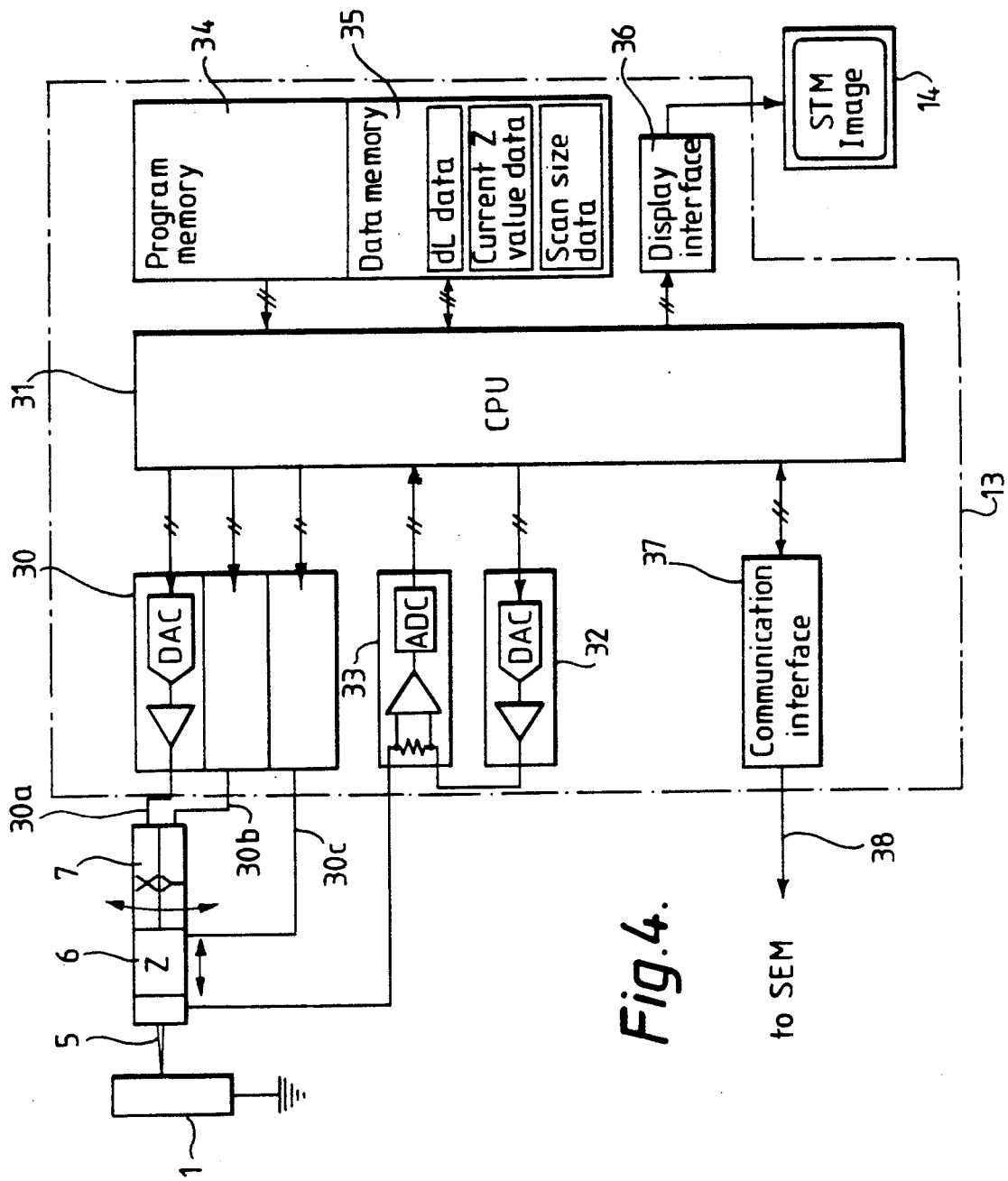
FIG. 4 shows a block diagram of the STM controller in the embodiment of FIG. 3.

FIG. 4 shows the structure of the STM control unit 13 in more detail. In the discussion of FIG. 3, it was mentioned that the STM control unit applied suitable voltages to the piezoelectric element 6, 7 which control the position of probe 5. The voltages for this are generated by a piezo-driver 30, having three channels 30a, 30b and 30c to the x, y, and z axes of the probe 5. The piezo-driver 30 is controlled via a processing unit 31. The processing unit 31 generates a control signal to bias voltage source 32 which applies a voltage to the probe 5. When the probe 5 is at its scanning distance from the sample 1, tunnel current flows from the bias voltage source 32 to the probe 5 and this is detected by a current amplifier 33, which generates a signal to the processing unit 31. Thus, the processing unit 31 can detect when the probe 5 is at its scanning distance. The processing unit 31 is connected to a program memory 34 and a data memory 35, and also via a display interface 36 to the STM image display unit 14.

When the probe 5 is scanning a target of the sample 1, the processing unit 31 controls the piezoelectric elements 6, 7 to cause the probe 5 to scan the sample, and the move to maintain it at the scanning distance from the sample, the processing unit monitoring that scanning distance via the current flowing in the probe from the bias voltage source 32, which is detected by the current amplifier 33. The variations in the position of the probe 5 in the z-axis represent variations in the height of the surface of the sample 1, and thus the signals necessary to the piezoelectric element 6 can be translated into changes in surface structure which can be displayed on the STM image display unit 14 via the display interface 36.

As shown in FIG. 4, the processing unit 31 is also connected via a communication interface 37 to a line 38 extending to the SEM.

Figure 5:
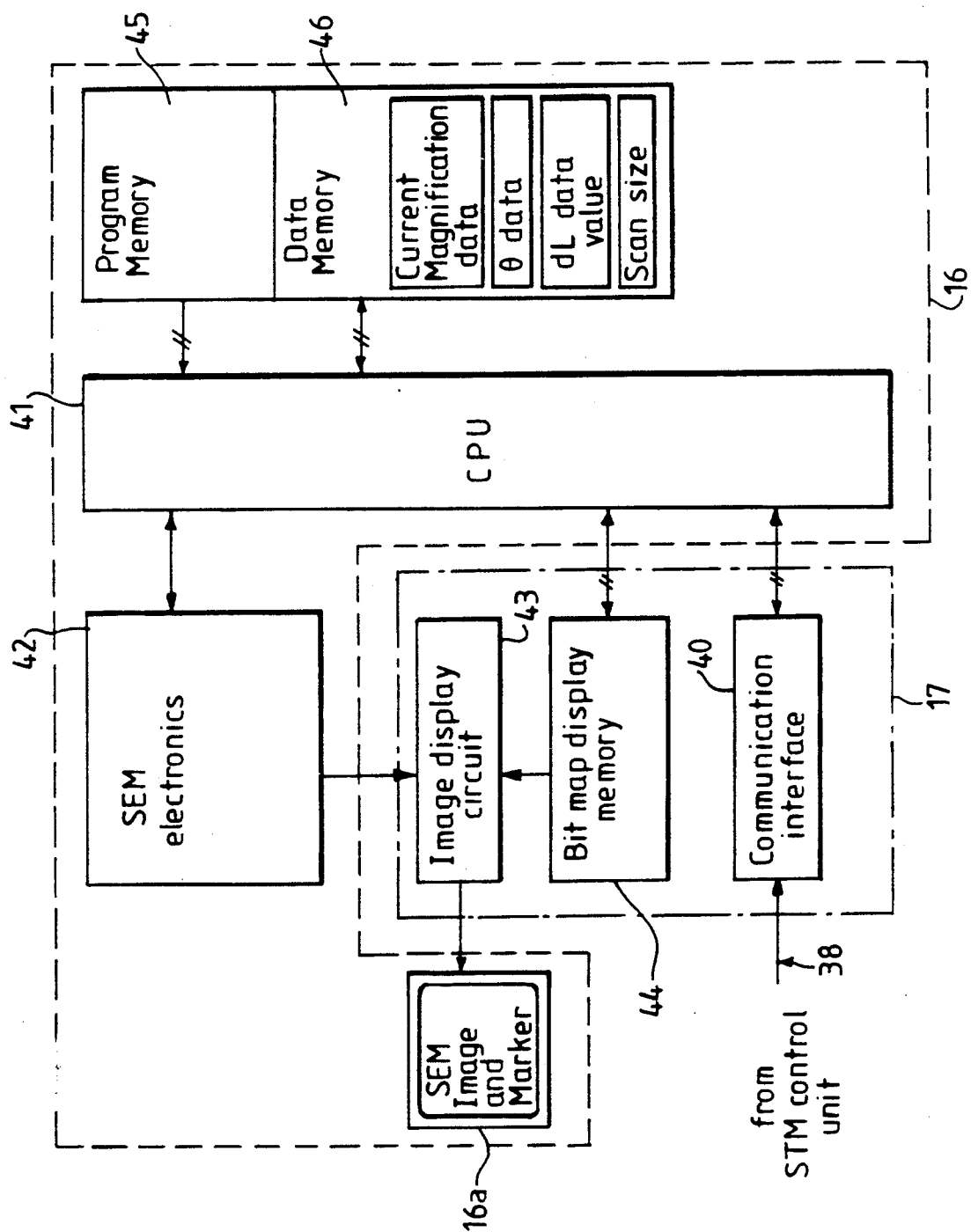
FIG. 5 shows a block diagram of the control system for the SEM display in the embodiment of FIG. 3.

Referring now to FIG. 5, the line 38 from the STM control unit passes to the graphic display unit 17 where it is received in a communication interface 40. That communication interface permits the information to be passed to a processing unit (CPU) 41 of the STM image display unit 16. That processing unit 41 is connected via suitable electronics arrangements 42 to an image display circuit 43, which controls the display 16a. In addition, however, a bit map display memory 44 generates a marker, under the control of the processing unit 41, and information concerning this marker is passed from the bit map display memory 44 to the image display circuit 43 to be displayed on the display 16a. FIG. 5 also shows that the processing unit 41 is connected to a program memory 45 and a data memory 46.

Figure 6:
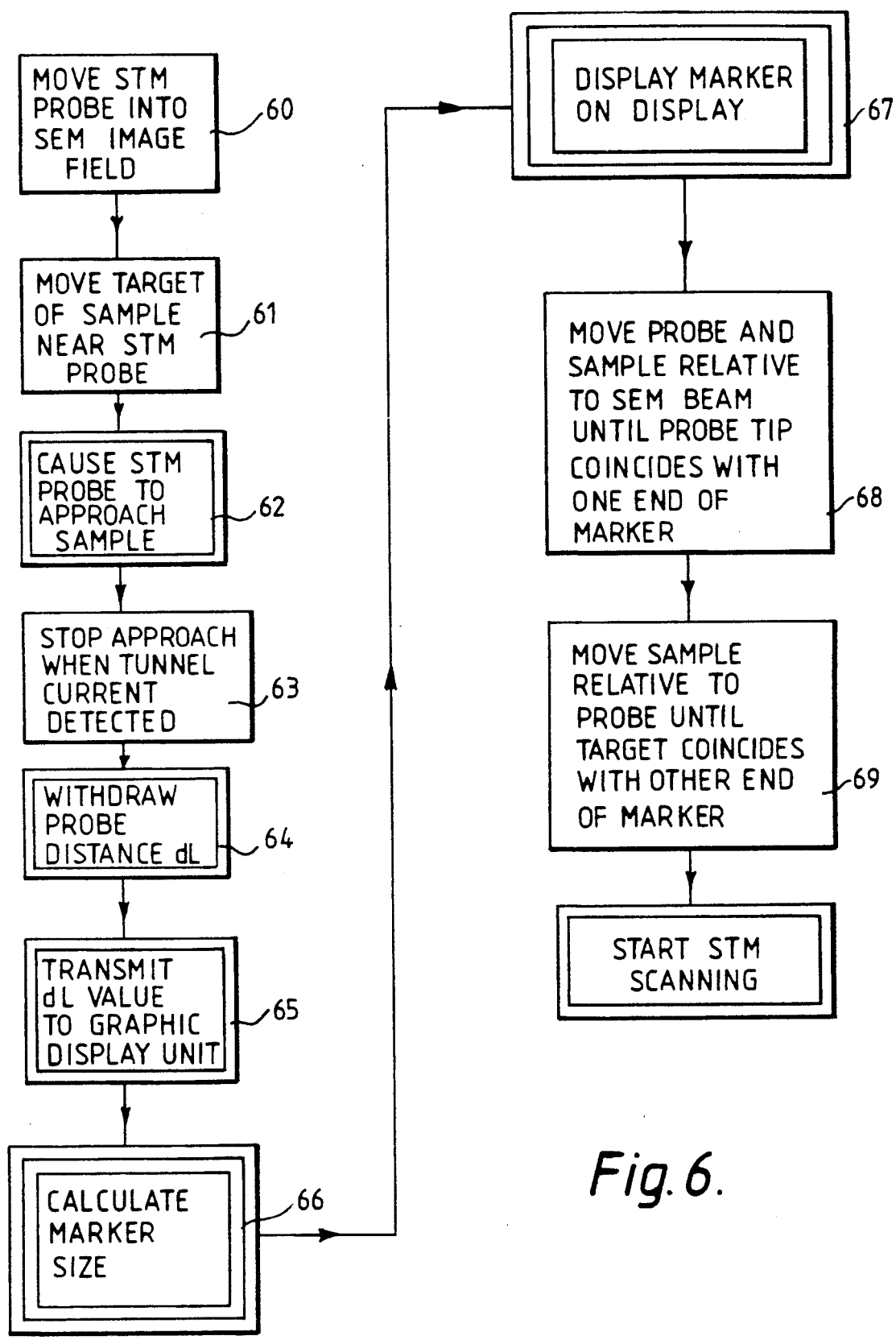
FIG. 6 is a flow chart of the sequence of operation of the embodiment of FIG. 3.

The setting-up and operation of the embodiment of the present invention shown in FIG. 3 will now be described with reference to the flow-chart of FIG. 6. In FIG. 6, boxes defined by single lines represent activities of the operator of the apparatus, boxes shown by double lines represent operations of the STM part of the apparatus, and boxes shown by triple lines represent operations of the SEM part of the apparatus.

In the following description, it will be assumed that the marker generated by the graphic display unit 17 on the display 16a is a line marker, whose length corresponds to the separation of the tip of the probe 5 from the sample 1, with one end point representing the approach point of the tip to the sample when the other end point coincides with the image of the tip of the probe 5, and the direction of the line marker represents the direction of movement of the probe 5 in the z-axis direction. However, other possible markers may be used with the present invention.

First the STM control unit 13 sets the voltage to be applied to the piezoelectric element 6 to a minimum value so as to position the probe 5 at its maximum separation from the sample 1. Then the movable table 9 is operated so as to allow the probe 5 to be viewed in a scanned electron beam image on the display of the SEM image display unit 16 (step 60 in FIG. 6). When this occurs the STM control unit 13 gradually increases the voltage applied to the piezoelectric element 6 (step 62) until the probe 5 approaches the sample 1 to the separation at which a tunnel current flows. When the tunnel current is detected (step 63), a prescribed voltage is subtracted from the applied voltage, then the resulting voltage is applied to the piezoelectric element 6. The prescribed voltage to be subtracted corresponds to a value which may induce, the movement of the probe 5 for instance as much as 1 μm from the sample. Generally, the distance between the probe 5 and the sample 1 with a tunnel current flowing through the probe 5 is about 1 to 2 nm. Thus, where a tunnel current is flowing, the probe 5 and the sample are nearly in contact. Therefore, the displacement (represented by dL in FIG. 3) of the probe 5 due to the piezoelectric element 6 corresponding to the above subtraction voltage may be considered to be the distance between the probe 5 and the sample 1. In this manner, the distance between the probe 5 and the sample 1 is determined (step 64). This distance or length is capable of being viewed for recognition as a marker with a corresponding length on the display 16a of the SEM image display unit 16, as will be described later.

Figure 7:
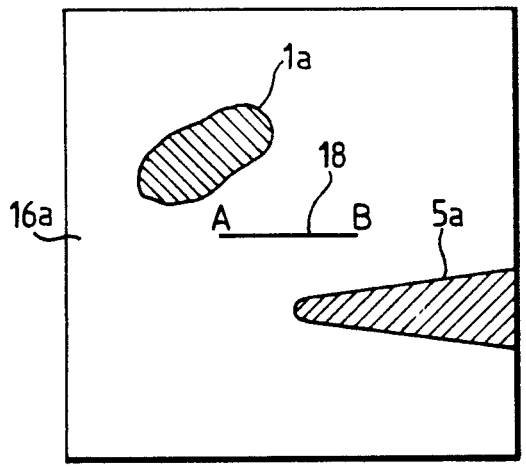
FIGS. 7 to 10 show examples of SEM displays which may be produced by the embodiment of FIG. 3.

The process for determining the above distance will now be discussed, together with its effect on the image on the, display unit 16. The distance dL obtained as described above, between the sample 1 and the probe 5, is transmitted to the graphics display unit 17 (step 65) It can be seen that the distance D between the tip of the image of the probes and the image of its point of sample surface if it moved a distance dL is determined on the display 16a of the SEM image display unit 16, by using the angle $\theta$ of the sample 1 relative to the beam 11, the magnification M of the SEM and the separation dL such that $D = M \times dL \times \sin\theta$). Thus, the display unit 17 calculates D from the above formula using preset tilt angle $\theta$ and scanning electron beam image magnification M (step 66), and generates a line marker with a length as calculated above (step 67). This calculation causes the image display circuit 43 to display a marker determined from the bit map memory, that marker being superimposed on the scanned electron image on the display 16a of SEM image display unit (step 67). FIG. 7 shows an example of a display 16a where a line marker 18 with a length between A and B is superimposed on an image 5a of the probe 5 and an image 1a of the target region. Then, the operator moves the probe 5 and sample 1 relative to the beam 11, with reference the SEM image as shown in FIG. 7, is changed so that the end B of the marker 18 and the tip of the probe 5a to coincide. This movement is achieved by moving the movable table 9, or by adjusting the off-set values of the SEM by deflecting the electron beam 11 as required.

Figure 8:
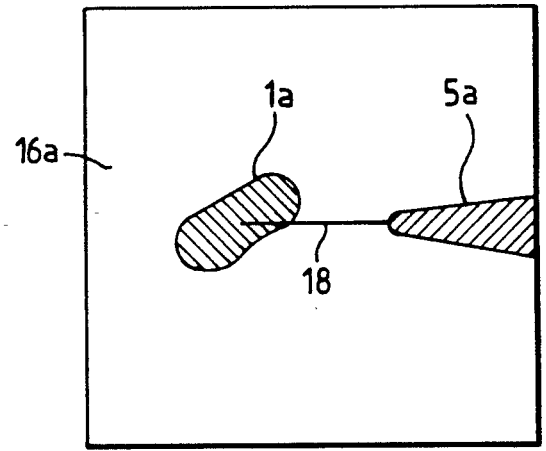

This is shown at step 68 in FIG. 6. Alternatively the control of the graphics display unit 17 may be such that, the position of the marker 18 can be changed with its direction unchanged so as to allow the end B of the marker 18 and the tip of the probe image 5a to coincide. When the probe image 5a and the line marker 18 are positioned correctly, the other end A of the marker 18 indicates the location on the sample 1, toward which the probe 5 will approach if the probe 5 is moved to a distance where tunnel current will flow and of STM measurement can occur. Thus, the target region 1a of the sample 1 desired to be observed by STM should have its position co-inciding the other end B of the marker 18 as shown in FIG. 8. This is achieved by adjusting the tables 2 and 3 in the X and Y axes, hence moving the sample 1 relative to the probe 5 (step 69). Then observation of the desired region of the sample 1 is may be conducted precisely on the display of the SEM image display unit 16 with the distance between the sample 1 and the tip of the probe 5 clearly displayed.

By going through the above process, the target region of the sample 1 is positioned correctly to coincide with the probe 5. The STM control unit 13 is controlled gradually to increase the voltage applied to the piezoelectric element 6 so as to bring the probe 5 in the vicinity of the sample 1 until a tunnel current is detected. Under such conditions, and by controlling the axial movement of the proe 5 so as to retain a constant tunnel current always, the piezoelectric element 7 is activated to allow the probe 5 to scan two dimensionally (step 70). Then, an STM image thus obtained for the desired observation region is displayed on the STM image display unit 14. In the above, if the distance dL is set at 1 μm and $\theta$ at 45°, dL sin equals 0.7 μm. Thus, although the scanning range of the scanning electron beam image generated by the STM can be as small as 2 to 3 μm, an adequate and precise setting may be achieved for such observation objects as small as 1 μm or less.

Figure 9:
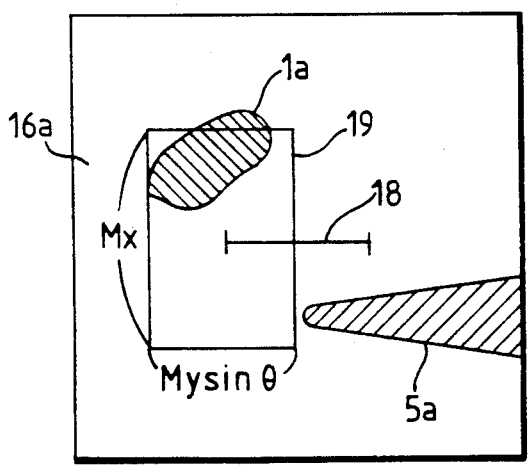

FIG. 9 shows an arrangement of this invention, wherein the display 16a of the SEM image display unit 16, shows in addition to the marker 18 indicating the distance between the probe 5 and the sample 1, a rectangular marker 19 indicating a region of scan by the probe 5. This marker 19 is also displayed on the display 16a through the operation of the graphics display unit 17. Suppose, the scanning range of the probe 5 over the surface of the sample 1 is a rectangle. If the length of the sides horizontal in FIG. 1 are set to be x, and the length of the other sides perpendicular to the horizontal are set to be y, the graphic display unit 17 will display on the display screen 16a a rectangular marker 19 having a side of a length of Mx and another side of a length My sin $\theta$. The interior of the marker 19 corresponds to the area on the surface of the sample to be scanned by the probe 5. Therefore, the sample 1 can be moved so as to allow the target region 1a for STM scanning to fall within the rectangular marker 19, by operating the tables 2 and 3. With such arrangements, a clear and distinct relationship in position between the region 1a of the sample desired to be observed and the probe image 5a will be obtained, allowing a precise measurement to be made by the STM.

It should be noted that although FIG. 9 shows the rectangular marker 19 being used in conjunction with the line marker 18, the use of a marker indicating the scan area of the probe 5 is an independent aspect of the present invention.

The rectangular marker 19 showing the area of scanning may be of any shape as long as it shows the area of scanning. Also, the positon of the marker 19 on the display 16a may be determined, for instance, by setting the origin of the position at the other end A of the line marker, indicating a contact point. Further in manner similar to the use of the line marker 18, the rectangular marker 19 may be used for correct positioning of the probe image 5a. Any appropriate point within the rectangular marker 19 may be used as a positioning mark.

Figure 10:
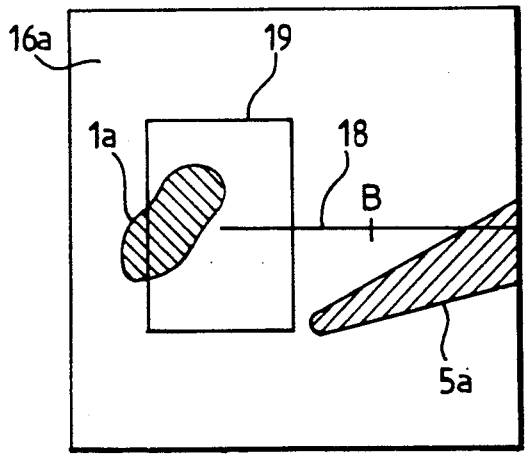

FIG. 10 shows an example of display 16a wherein the B end of the marker 18 is extended into the location of the probe image 5a. Sometimes, when the electron beam 11 of the SEM 10 is deflected, the direction of scanning of the electron beam 11 is not always perpendicular to the direction of movement of the probe 5 in the z-axial (i.e. towards or away from the sample). In such cases, it is necessary to rotate the scanning direction of the electron beam so as to allow the direction of movement of the probe image 5a and the marker 18 to coincide. This is acieved by rotating the electron beam 11 until the direction of the probe image 5a and the direction of the marker 18 are the same and this may be viewed on the display 16a screen for easier recognition. If both directions are made to co-incide by the rotary movement described above, the end B and the tip of the probe image 5a may easily be made to co-incide, allowing the desired observation region 1a of the sample 1 to be set up precisely by means of the SEM.

In the above embodiments, the markers displayed on the display of the SEM image display unit 16 have been in the form of a line or rectangle, but the present invention is not limited to this, and any form may be used according to the present invention. More specifically, it will be sufficient if there is displayed at least a mark showing the probe to sample separation, but preferably the probe to sample approach point is also shown on the display 16a of the SEM image display unit 16. Further, in the above embodiment an example of positioning by using the extended line mark 18 to align with the probe image 5a was described. Such alignment positioning through the movement or rotation as above may also be performed by using an appropriate point on the rectangular mark 19.

Many modifications to the above embodiment are possible. For example, the above description assumes that it is the operator who controls the movement of the probe and sample relative to the electron beam to cause the tip of the image 5a of the probe 5 to co-incide with the end B of the marker 18. However, in practice the image 5a of the probe 5 is shown on the display 16 with a high contrast relative to the sample surface, and therefore image recognition systems, known in the art, will enable the location of the image 5a of the tip of the probe 5 to be determined automatically. Then, it is possible for the movement of the sample and probe to cause the image 5a of the probe 5 to co-incide with the end B of the marker 18 to be carried out automatically. It is also possible, of course, for the end A of the line marker 18 first to be aligned with the target image 1a, and then the image 5a of the tip of the probe 5 be moved to co-incide with the end B of marker 18. However, this would be difficult to achieve, unless the probe itself was capable of being moved in the X and Y directions relative to the sample. Although it is preferable that the marker 18 indicates the direction of movement of the probe 5 in the z-axis, it s possible to operate when the line marker 18 and the movement of the probe 5 are not aligned. However, in this case, when the probe is moved to the scanning separation, it may be necessary to form that movement in a series of steps, with a length of the marker 18 being re-calculated at each step. This is more troublesome for the operator.

As may be understood from the above description, a combined scanning electron and scanning tunnelling microscope apparatus according to the present invention has the advantages that: (i) because the apparatus is designed to allow the sample and the probe of the STM therein to be displayed on the display of the SEM image display unit at the same time, and also to allow a marker indicating the relationship between the sample and the probe. The mutual positions and distances can be shown on the same display screen; (ii) an extremely small section of less than 100 μm desired to be observed by STM can be chosen and set up by viewing both the sample surface and the probe through SEM. If an STM is used alone, a lot of time is required for setting a region for observation because scanning by STM takes time. However, when combined with an SEM, this operation time will be reduced significantly.

What is claimed is:

1. A combined scanning electron and scanning tunnelling microscope apparatus, comprising;
   support means for movably supporting a sample;
   a scanning electron microscope for scanning the sample to generate a scan image;
   a display for displaying the scan image of the scanning electron microscope;
   a probe for a scanning tunnelling microscope movably located adjacent the support means, the probe being arranged to move in a predetermined direction relative to the support means; and
   means for generating a marker X, on said display, said marker representing a probe-to-sample separation.

2. An apparatus according to claim 1, wherein said marker also represents a probe-to-sample approach point.

3. An apparatus according to claim 1, wherein said marker also indicates said predetermined direction.

4. An apparatus according to claim 1, wherein said marker is a line marker with a length corresponding to said probe-to-sample separation, a direction corresponding to said predetermined direction, and an end point corresponding to a probe to sample approach point.

5. An apparatus according to claim 4, wherein said marker has a further point for alignment with an end point of the image of said probe on said display.

6. An apparatus according to claim 5, wherein said further point is another end point of said marker.

7. An apparatus according to claim 5, wherein said line marker has an extension for indicating the axis of orientation of the probe.

8. An apparatus according to claim 1, further including means for moving said probe in a scan area of said sample, and said means for generating said marker is arranged to generate a further marker on said display, said further marker representing said scan area.

9. A scanning tunnelling microscope apparatus for combination with a scanning electron microscope, comprising:
   a probe movably locatable adjacent support means for a sample;
   means for moving said probe in a scanning pattern;
   means for generating a tunnel current in said probe; and
   a graphic display unit for controlling a display, said graphic display unit including means for causing said graphic display unit to generate on the display a marker representing a probe-to-sample separation.

10. A combined scanning electron and scanning tunnelling microscope apparatus, comprising;
    support means for movably supporting a sample;
    a scanning electron microscope for scanning the sample to generate a scan image;

a display for displaying the scan image of the scanning electron microscope;

a probe for a scanning tunnelling microscope movably located adjacent the support means, the probe being arranged to move in a predetermined direction relative to the support means;

means for causing said probe to scan a scan area of said sample; and means for generating a marker on said display, said marker representing said scan area.

11. A scanning tunnelling microscope apparatus for combination with a scanning electron microscope, comprising:

a probe movably locatable adjacent support means for a sample;

means for moving said probe in a scanning pattern;

means for generating a tunnel current in said probe; and a graphic display unit for controlling a display, said graphic display unit including means for causing said graphic display unit to generate on the display a marker representing the scan area of said scanning pattern.

12. A method according to claim 11, wherein said scanning electron microscope generates an electron beam for scanning the sample, and said step of adjusting the relative position of said probe and sample comprises:

moving the path of said electron beam relative to said probe and sample so as to cause the image of said probe and sample to move on said scan image until the image of said probe co-incides with a first part of said marker; and moving said sample relative to said probe to cause the image of the target of said sample on said scan image to co-incide with a second part of said marker.

13. A method according to claim 11 wherein said step of adjusting the relative position of said probe and sample comprises:

moving the location of said marker on said display so as to cause a first part of said marker to co-incide with the image of said probe; and moving said sample relative to said probe to cause the image of the target of said sample on said scan image to co-incide with a second part of said marker.

14. A combined scanning electron and scanning tunnelling microscope apparatus for scanning a sample having a scanning electron microscope, a scanning tunnelling microscope, and a display, wherein the display has thereon a scan image of a probe of said scanning tunnelling microscope and a part of said sample, and a marker representing a probe to sample separation generated thereon.

15. An apparatus according to claim 14 wherein said marker is superimposed on said scan image.

16. A combined scanning electron and scanning tunnelling microscope apparatus for scanning a sample having a scanning electron microscope, a scanning tunnelling microscope, and a display, wherein the display has thereon scan image of a probe of said scanning tunnelling microscope and a part of said sample, and a marker representing a scan area of said probe superimposed on said scan image.

17. A method of scanning a target of a sample, comprising;

locating a probe of a scanning tunnelling microscope adjacent a sample with a predetermined separation therefrom, the probe being movable relative to the sample in a predetermined direction to a scanning separation;

generating on a display, a scanning electron microscope scan image of said sample and said probe;

generating on the display a marker representing the predetermined separation;

adjusting the relative position of said probe and sample so that said probe is located at said predetermined separation from said target of said sample;

moving said probe towards said sample in said predetermined direction from said predetermined separation to the scanning separation; an scanning said target of said sample with said probe.

18. A method according to claim 17, wherein said generating of said market involves generation of said marker so that said marker further represents a probe-to-sample approach point.

19. A method according to claim 17, wherein said generating of a marker involves generation of said marker so that said marker further represents said predetermined direction.

20. A method according to claim 19, wherein the marker is a line marker extending in a selected direction, and the method includes aligning a predetermined direction with said selected direction.

21. A method according to claim 20, wherein said scanning electron microscope generates an electron beam for scanning the sample, and the aligning of said predetermined direction with said selected direction comprises:

moving the path of said electron beam relative to said probe and sample so as to cause the image of said probe and sample to move on said scan image until the predetermined direction is aligned with the selected direction.

22. A method according to claim 20, wherein the aligning of said predetermined direction with said selected direction is achieved by movement of the probe so as to move said predetermined direction relative to the sample.

23. A method according to claim 17, wherein said step of locating said probe adjacent the sample comprises positioning the probe adjacent any point of said sample, causing said probe to approach the sample, detecting probe current to detect when said probe is at said scanning separation from said any point of the sample, and withdrawing said probe from said sample to said predetermined separation.

24. A method according to claim 17, wherein said step of adjusting the relative position of said probe and sample comprises:

moving said probe and said sample relative to said scanning electron microscope so as to cause the image of said probe in said scan image to co-incide with a first part of said marker; and moving said sample relative to said probe to cause the image of the target of said sample on said image to co-incide with a second part of said marker.

* * * * *